United States Patent
Blumen et al.

(10) Patent No.: US 7,414,466 B2
(45) Date of Patent: Aug. 19, 2008

(54) APPARATUS FOR REDUCING OFFSET VOLTAGE DRIFTS IN A CHARGE AMPLIFIER CIRCUIT

(75) Inventors: Arthur Russell Blumen, Centreville, VA (US); Kenneth R. Knowles, Manassas, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 153 days.

(21) Appl. No.: 11/472,578

(22) Filed: Jun. 22, 2006

(65) Prior Publication Data

US 2007/0296496 A1    Dec. 27, 2007

(51) Int. Cl.
*H03F 3/45* (2006.01)
*H03F 13/00* (2006.01)

(52) U.S. Cl. .................................. 330/69; 330/174
(58) Field of Classification Search ............ 330/9, 330/147; 327/307
See application file for complete search history.

(56) References Cited

U.S. PATENT DOCUMENTS

| 7,049,729 B2 * | 5/2006 | Kashiwase et al. .......... 310/319 |
| 2002/0125943 A1 * | 9/2002 | Yamashita .................... 330/69 |

* cited by examiner

*Primary Examiner*—Steven J Mottola
(74) *Attorney, Agent, or Firm*—Daniel J. Long; Antony P. Ng; Dillon & Yudell LLP

(57) ABSTRACT

An apparatus for reducing offset voltage drifts in a charge amplifier circuit is disclosed. The apparatus includes a charge amplifier circuit and a bias current compensation circuit. The bias current compensation circuit supplies bias current to lower any offset voltage drift at the output of the charge amplifier.

8 Claims, 2 Drawing Sheets

APPARATUS FOR REDUCING OFFSET VOLTAGE DRIFTS IN A CHARGE AMPLIFIER CIRCUIT

STATEMENT OF GOVERNMENT INTEREST

The present invention was made with United States Government support under contract number 03-009019-47236. The United States Government has certain rights in the present invention.

BACKGROUND OF THE INVENTION

1. Technical Field

The present invention relates to sensing circuits in general, and in particular to charge amplifier circuits. Still more particularly, the present invention relates to an apparatus for reducing offset voltage drifts in a charge amplifier circuit.

2. Description of Related Art

Referring now to the drawings and in particular to FIG. 1, there is illustrated a schematic diagram of a charge amplifier circuit capable of converting the output of a piezoelectric charge mode sensor to a corresponding voltage, according to the prior art. As shown, a charge amplifier circuit 10 includes a piezoelectric sensor 11 that is capable of producing a charge proportional to an applied mechanical force. As the voltage at one of the inputs to an operational amplifier 12 begins to increase (or decrease) as a result of charge accumulation across a capacitor 14, the voltage at an output V0 of operational amplifier 12 will decrease (or increase) to maintain the voltage at the input of operational amplifier 12 at near 0 V. Thus, the voltage of output V0 is proportional to the charge output of piezoelectric sensor 11, and the virtual ground at the second input of operational amplifier 12 limits the charge lost due to parasitic capacitance and/or leakage in all cables within charge amplifier circuit 10.

The capacitance C1 of capacitor 14 determines the voltage at output V0 for a given amount of charges generated by piezoelectric sensor 11. Due to the input bias/offset current ib, a resistor 13 is utilized to drain the accumulated charges on capacitor 14. With resistor 13, operational amplifier 12 acts as a high-pass filter with a low-frequency cutoff at $1/(2\pi R1C1)$ where R1 is the resistance of resistor 13, and C1 is the capacitance of capacitor 14.

Because capacitor 14 requires a relatively small capacitance C1 to achieve a reasonable output voltage, one problem with charge amplifier circuit 10 is that the resistance R1 of resistor 13 must be very large in order to achieve a reasonable low-frequency cutoff. The input bias/offset current ib of operational amplifier 12 flowing over resistor 13 can cause a significant DC offset at output V0. In addition, the change in the input bias/offset current ib over temperature can also result in a significant offset drift at output V0. Even when using a JFET operational amplifier having an input bias/offset current and drift (per degree Celsius) in the pico range, the DC offset and offset drift (per degree Celsius) at output V0 can end up being in the milli range, which is unacceptably high for most, if not all, precision applications. Consequently, it would be desirable to provide an apparatus for reducing offset voltage drifts at the outputs of charge amplifier circuits.

SUMMARY OF THE INVENTION

In accordance with a preferred embodiment of the present invention, an apparatus for reducing offset voltage drifts in a charge amplifier circuit includes a charge amplifier circuit and a bias current compensation circuit. The bias current compensation circuit supplies bias current to lower any offset voltage drift at the output of the charge amplifier.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 2:
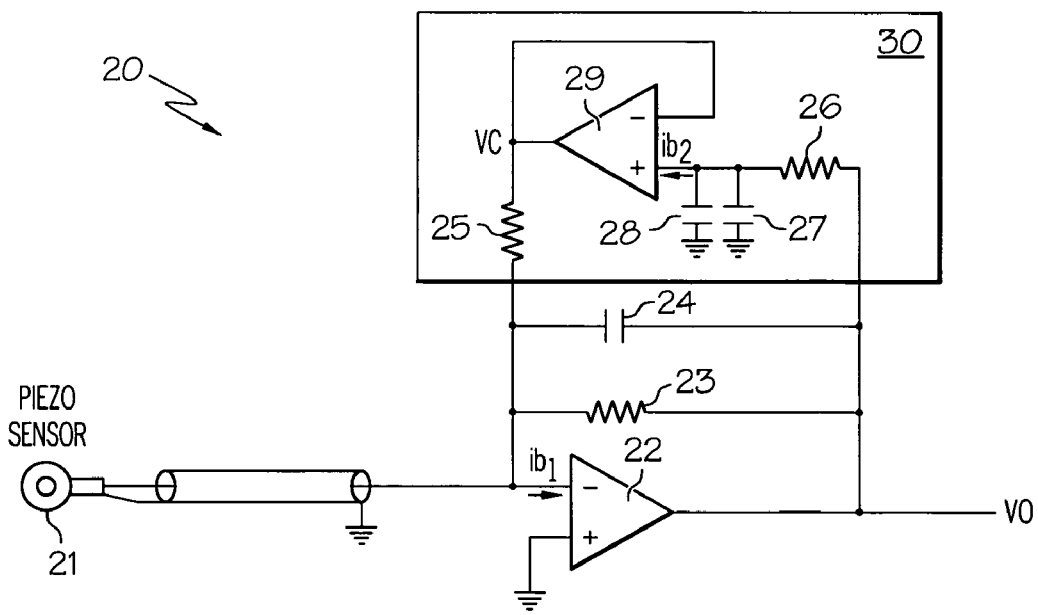
FIG. 2 is a schematic diagram of a charge amplifier circuit, in accordance with a preferred embodiment of the present invention.

With reference now to FIG. 2, there is illustrated a schematic diagram of a charge amplifier circuit, in accordance with a preferred embodiment of the present invention. As shown, a charge amplifier circuit 20 includes a piezoelectric sensor 21, an operational amplifier 22, a resistor 23 and a capacitor 24. Charge amplifier circuit 20 also includes a bias current compensation circuit 30 having an operational amplifier 29, resistors 25-26, and capacitors 27-28. Within bias current compensation circuit 30, a node VC tracks the voltage changes at output V0 (due to DC offset and offset drift) that are significantly below the cutoff frequency of a low-pass filter formed by resistor 25 and capacitors 27-28.

Any voltage change at node VC, through negative feedback, counteracts and limits the (low-frequency) voltage change at output V0. Thus, any DC offset caused by input bias/offset current will be attenuated by the loop gain 1+R1/R2, where R1 is the resistance of resistor 23 and R2 is the resistance of resistor 25. The voltage level shifting of node VC causes most of the bias current to flow through resistor 25 that has a much lower resistance value than that of resistor 23.

Figure 1:
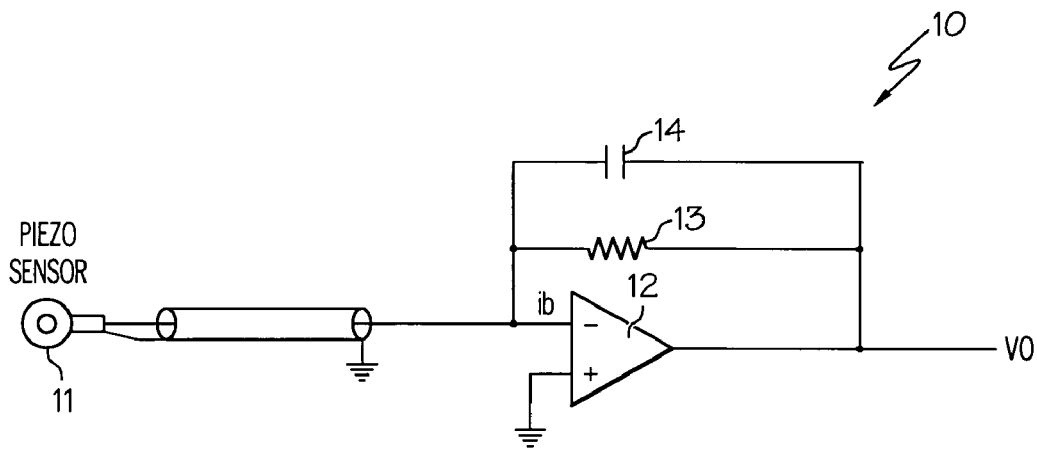
FIG. 1 a schematic diagram of a charge amplifier circuit, according to the prior art.

The offset voltage caused by an input bias current $ib_2$ (to operational amplifier 29) flowing through resistor 26 adds to the DC offset in output V0, but the total offset voltage due to the bias current $ib_2$ will be significantly less than that of charge amplifier circuit 10 from FIG. 1. This is because the sum of resistances of resistors 25 and 26 is much less than the resistance of resistor 23. For example, with resistors 23, 25 and 26 having resistances 1.1 GΩ, 5.76 MΩ and 5.76 MΩ, respectively, the sum of resistances of resistors 25 and 26 is approximately 95 times less than the resistance of resistor 23.

If the cutoff frequency of a low-pass filter formed by resistor 26 and capacitors 27-28 is significantly higher than the rate of change of input signals to operational amplifier 22, then node VC will track the offset drift of the voltage at output V0 while supplying most of the input bias current $ib_1$ for operational amplifier 22 via resistor 25. On the other hand, if the cutoff frequency of the low-pass filter formed by resistor 26 and capacitors 27-28 is significantly lower than the rate of change of input signals to operational amplifier 22, then node VC will not change much in response to the input signals to operational amplifier 22, and will not distort the output of operational amplifier 22.

Basically, charge amplifier circuit 20 becomes a second order high-pass filter circuit after the addition of bias current compensation circuit 30. The low-frequency cutoff of such high-pass filter is slightly less than $1/(2\pi R1C1)$, where R1 is the resistance of resistor 23, and C1 is the capacitance of capacitor 24, and rolls off at a −40 dB per decade rate as the frequency of input signals to operational amplifier 22 approaches zero.

With operational amplifier 22 being a JFET device, and resistor 23 being in the gigaohm range, input bias current $ib_1$ at room temperature (approximately 25° C.) has roughly the same effect on DC offset as the offset voltage. At room temperature, bias current compensation circuit 30 only has a moderate effect on the total DC offset on charge amplifier circuit 20. But since the bias current in a JFET device doubles for every ten degree Celsius rise in temperature, virtually all of the DC offset will be caused by the effect of input bias current at higher temperatures. At higher temperatures, bias current compensation circuit 30 can reduce the DC offset by a factor approaching the ratio of R1/(R2+R3), where R1 is the resistance of resistor 23, R2 is the resistance of resistor 25 and R3 is the resistance of resistor 26.

The choice of values for the discrete components within bias current compensation circuit 30 involves making a reasonable tradeoff among DC offset/offset drift, stability and noise gain. To ensure stability, the total loop gain at the high-pass filter cutoff frequency (which is defined by resistor 23 and capacitor 24) must be less than 1, since the phase shifts from −90° to −180° at this point. In order to keep the loop gain less than 1, the attenuation of the low-pass filter (which is defined by resistor 25 and capacitors 27-28) must be greater than the gain introduced by R1/R2, where R1 is the resistance of resistor 23, and R2 is the resistance of resistor 25. This places an upper limit on the high-pass filter cutoff frequency, which in turn limits the rate of offset drift that can be effectively canceled by bias current compensation circuit 30.

For charge amplifier circuit 20, if the resistance R1 of resistor 23=1.1 GΩ, and the resistance R2 of resistor 25=5.76 MΩ, then R1/R2=191. So the attenuation of the low-pass filter should be at least −45.6 dB (1/191) at 2.1 Hz ($1/(2\pi R1C1)$, where C1 is the capacitance of capacitor 24). The gain of the low-pass filter at 2.1 Hz is:

$$\frac{1}{\sqrt{1^2 + [2\pi \cdot 2.1(C2 + C3)R3]^2}}$$

which equals to 1/334 or −50 dB, where R3 is the resistance of resistor 26=5.76 MΩ, C2 is the capacitance of capacitor 27=2.2 μF, and C3 is the capacitance of capacitor 28=2.2 μF. The gain margin is then −50 dB −(−45.6 dB)=−4.4 dB.

In addition, the gain of the low-pass filter at 1.2 Hz is:

$$\frac{1}{\sqrt{1^2 + [2\pi \cdot 1.2(C2 + C3)R3]^2}}$$

which equals to 1/191. This equals to R1/R2, so the total loop gain is 1 at 1.2 Hz. At this frequency, the phase margin is:

$$180° - 90° - \tan^{-1}(2\pi \cdot 1.2 \cdot R1C1)$$

which equals to 61°.

The combination of resistors 23 and 25 acts as an amplifier for noise at the output of operational amplifier 22 having a gain of R1/R2. This places a lower limit on the value of resistor 25. The peak noise gain R1/R2 occurs at the cutoff frequency of the high-pass filter formed by resistor 23 and capacitor 24.

The value of the DC offset at the output V0 of operational amplifier 22 is approximately equal to:

$$R2 \cdot ib_1 + R3 \cdot ib_2 + Vos_1 + Vos_2$$

where $ib_1$ is the bias current to operational amplifier 22, $ib_2$ is the bias current to operational amplifier 29, $Vos_1$ is the offset voltage of operational amplifier 22, and $Vos_2$ is the offset voltage of operational amplifier 29. So by reducing the resistances of resistors 25 and 26, both the DC offset and offset drift can be reduced, but possibly at the expense of noise gain and/or stability.

Figure 3:
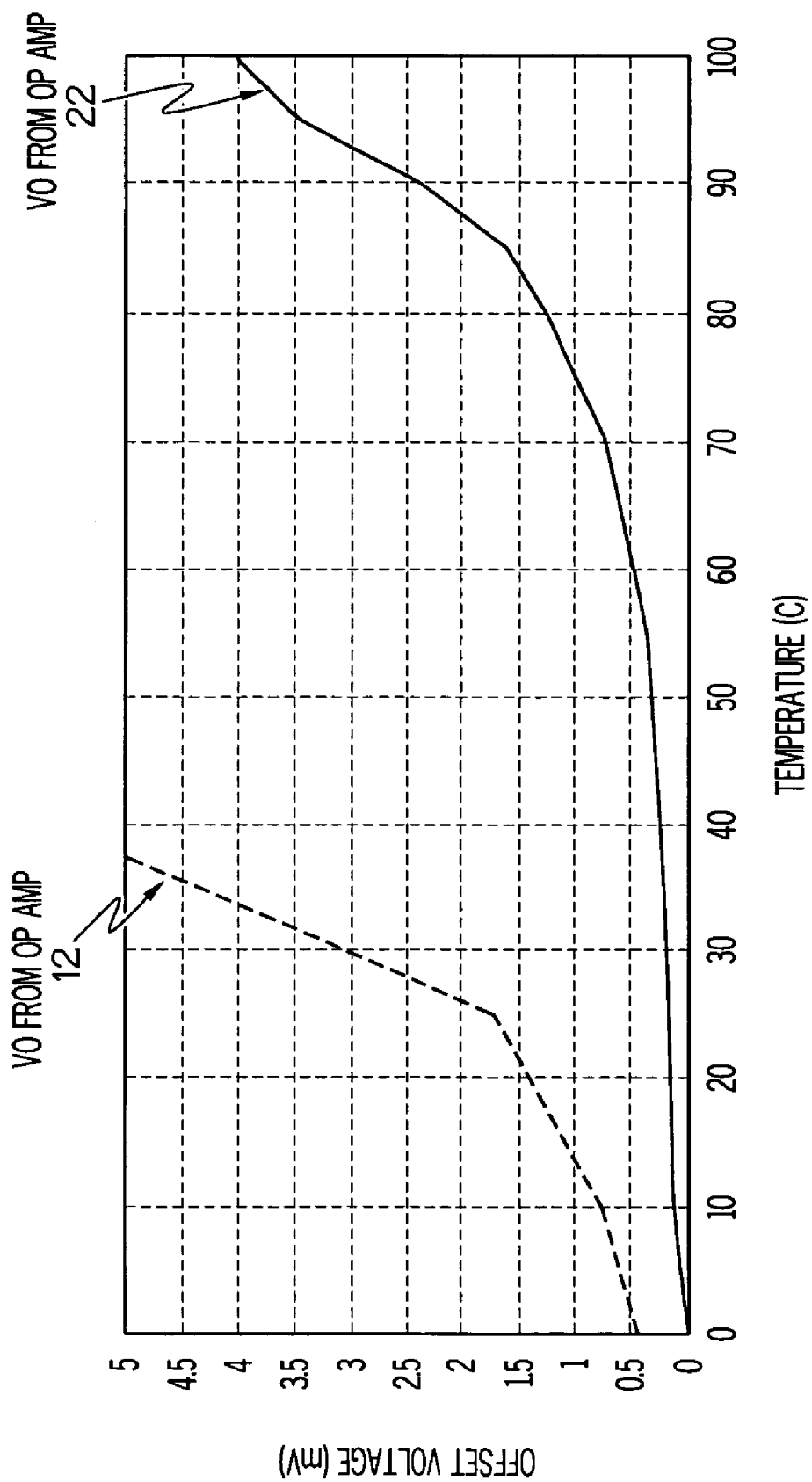
FIG. 3 is a chart illustrating offset voltage verses temperature for the charge amplifier circuits from FIG. 1 and FIG. 2.

With reference now to FIG. 3, there is depicted a chart illustrating offset voltage verses temperature for charge amplifier circuit 10 from FIG. 1 and charge amplifier circuit 20 from FIG. 2. At 25° C. (room temperature), bias current compensation circuit 30 only reduces the offset voltage by a factor of 6, because a large portion of the 250 μV offset is caused by the offset voltage. At 100° C., bias current compensation circuit 30 reduces the offset voltage from 400 mV to around 4 mV, which is almost a 100× reduction.

As has been described, the present invention provides an apparatus for reducing offset voltage drifts in a charge amplifier circuit.

While the invention has been particularly shown and described with reference to a preferred embodiment, it will be understood by those skilled in the art that various changes in form and detail may be made therein without departing from the spirit and scope of the invention.

What is claimed is:

1. An apparatus comprising:
    a charge amplifier circuit includes an operational amplifier having a positive input and a negative input;
    a bias current compensation circuit, connected to an output and said negative input of said operational amplifier, for supplying bias current to said negative input of said operational amplifier in order to lower any offset voltage drifts at said output of said operational amplifier.

2. The apparatus of claim 1, wherein said charge amplifier circuit includes a piezoelectric sensor, a resistor, and a capacitor.

3. The apparatus of claim 2, wherein said resistor and said capacitor are connected in parallel to said output and said negative input of said operational amplifier.

4. The apparatus of claim 1, wherein said positive input of said operational amplifier is connected to ground.

5. The apparatus of claim 1, wherein said bias current compensation circuit includes a second operational amplifier having an output for injecting said bias current into said negative input of said operational amplifier via a resistor.

6. The apparatus of claim 5, wherein said second operational amplifier includes a negative input connected to said output of said second operation amplifier.

7. The apparatus of claim 6, wherein said bias current compensation circuit includes a second resistor connected between a positive input of said second operational amplifier and said output of said operational amplifier of said charge amplifier circuit.

8. The apparatus of claim 7, wherein said bias current compensation circuit further includes a capacitor connected between said positive input of said second operational amplifier and ground.

* * * * *